United States Patent [19]

Takahashi

[11] Patent Number: 5,162,677
[45] Date of Patent: Nov. 10, 1992

[54] ECL TO CMOS LEVEL CONVERSION CIRCUIT

[75] Inventor: Hiroyuki Takahashi, Tokyo, Japan

[73] Assignee: NEC Corporation, Tokyo, Japan

[21] Appl. No.: 667,491

[22] Filed: Mar. 11, 1991

[30] Foreign Application Priority Data

Mar. 13, 1990 [JP] Japan .................................. 2-62261

[51] Int. Cl.[5] .................. H03K 19/092; H03K 19/086
[52] U.S. Cl. .................................... 307/475; 307/451; 307/455
[58] Field of Search ............... 307/475, 450, 451, 455, 307/448

[56] References Cited

U.S. PATENT DOCUMENTS

| | | | |
|---|---|---|---|
| 4,697,109 | 9/1987 | Honma et al. | 307/475 |
| 4,779,016 | 10/1988 | Sugiyama et al. | 307/475 |
| 4,798,981 | 1/1989 | Tsugaru et al. | 307/475 |
| 4,992,681 | 2/1991 | Urakawa et al. | 307/475 |

Primary Examiner—Edward P. Westin
Assistant Examiner—Richard Roseen
Attorney, Agent, or Firm—Laff, Whitesel, Conte & Saret

[57] ABSTRACT

A level conversion circuit has an input buffer circuit which includes bipolar transistors and a complementary type inverter circuit which includes a P-channel first field effect transistor and an N-channel second field effect transistor. An input signal having a small amplitude is inputted to directly a gate terminal of the first field effect transistor and to a gate of the second field effect transistor through a coupling capacitor with no time delay. The complementary type inverter circuit outputs an output signal having a large amplitude. The coupling capacitor is interposed between the gates of the first and second field effect transistors forming the inverter circuit and this arrangement enables the level conversion circuit to operate at a high speed and at a reduced power consumption.

5 Claims, 7 Drawing Sheets

F I G. 3
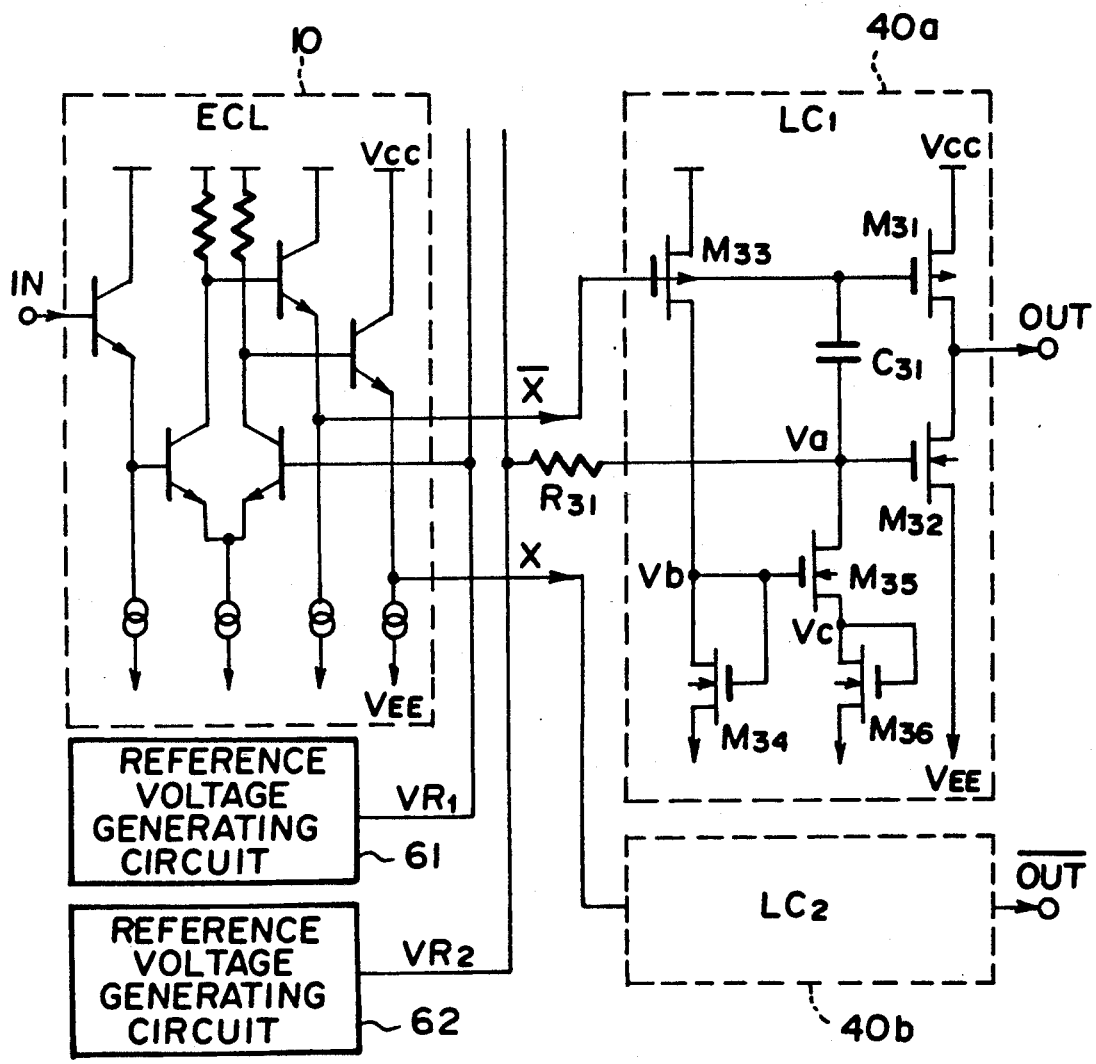

ECL TO CMOS LEVEL CONVERSION CIRCUIT

BACKGROUND OF THE INVENTION

The present invention relates to a level conversion circuit for use in a semiconductor integrated circuit device and, more particularly, to a level conversion circuit for converting a level of a signal from its small amplitude to large amplitude at a high speed.

In the prior art level conversion circuits which are fully explained later for assisting the understanding of the present invention, the ON and OFF operation at the side of an N-channel MOS transistor which forms the CMOS inverter is effected through the N-channel MOS transistor current mirror circuit which responds to a P-channel MOS transistor switch of either a source input type or a gate input type and, consequently, the ON and OFF operation involves a large time day. Also, when the output is of a low level, the current mirror circuit of the N-channel MOS transistors turns on and this causes the flow of a through current. These problems which are also fully explained later are regarded as presenting serious problems to be solved for the realization of a circuit which can operate at a high speed and at a low power consumption.

SUMMARY OF THE INVENTION

It is, therefore, an object of the invention to overcome the problems existing in the conventional level conversion circuit and to provide an improved level conversion circuit which is capable of operating at a high speed and at a low power consumption.

According to one aspect of the invention, there is provided an improved level conversion circuit which comprises:

an input buffer circuit which includes bipolar transistors and which receives an input signal having a small amplitude and outputs an output signal having a predetermined phase and amplitude;

a level conversion section which includes a complementary type inverter circuit having a P-channel type first field effect transistor and an N-channel type second field effect transistor for receiving the output signal from the input buffer circuit at gate terminals of the first field effect transistor and the second field effect transistor, the inverter circuit outputting an output signal whose level has been converted to a large amplitude from a small amplitude of the input signal; and a capacitor connected between the gate terminals of the first field effect transistor and the second field effect transistor.

According to the present invention, the input signal is directly inputted to the gate of the P-channel transistor of the output driving CMOS inverter of the level conversion circuit for having this P-channel transistor turned ON and OFF and the input signal is transmitted without a delay time to the gate of the N-channel transistor through the coupling capacitor disposed between the gate of this N-channel transistor and that of the P-channel transistor for having the N-channel transistor turned ON and OFF.

As compared with the conventional level conversion circuits in which the N-channel side is formed by a current mirror circuit, the level conversion circuit provided by the present invention is one in which the power consumption is reduced to 1/5-1/6 and the delay time is shortened by 30-40%, thereby enabling a high speed operation of the circuit.

Further, the gate of the N-channel MOS transistor to which the capacitor is coupled is provided with a level setting circuit for the steady states and this ensures a stable level conversion operation.

BRIEF DESCRIPTION OF THE DRAWINGS

The above and other objects, features and advantages of the present invention will be apparent from the following description of preferred embodiments of the invention explained with reference to the accompanying drawings, in which:

FIG. 3 is a circuit diagram of a level conversion circuit as a second embodiment according to the present invention;

PREFERRED EMBODIMENTS OF THE INVENTION

Throughout the following explanation, similar reference symbols or numerals refer to the same or similar elements in all the figures of the drawings.

Figure 7:
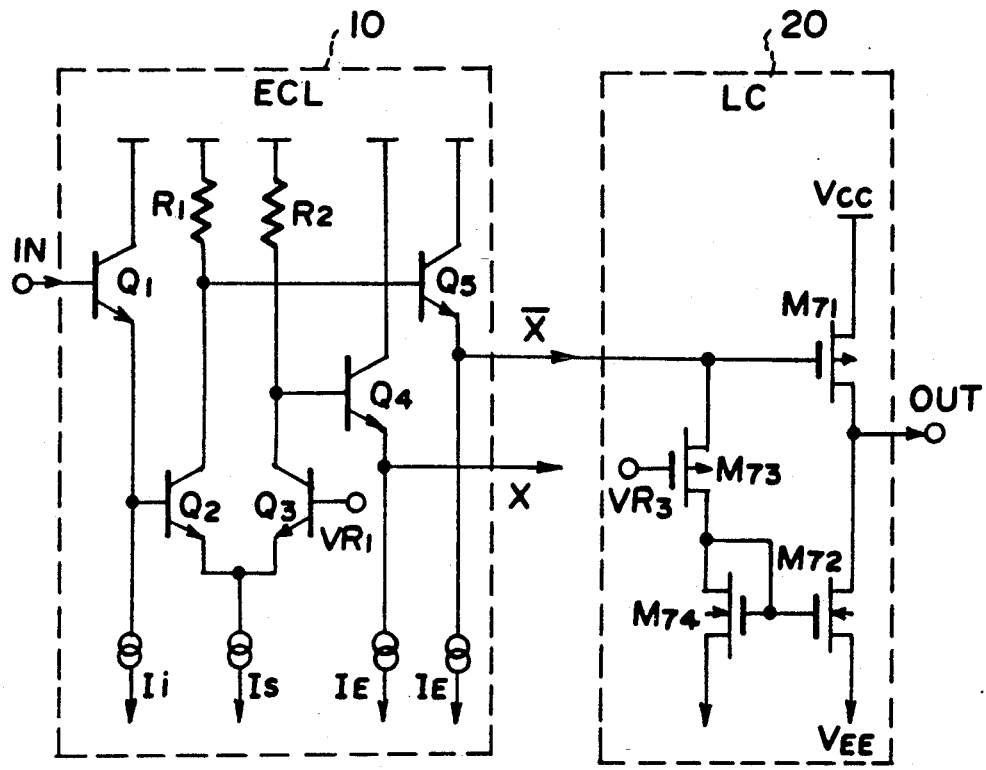
FIG. 7 is a circuit diagram of a first conventional level conversion circuit.
Figure 8:
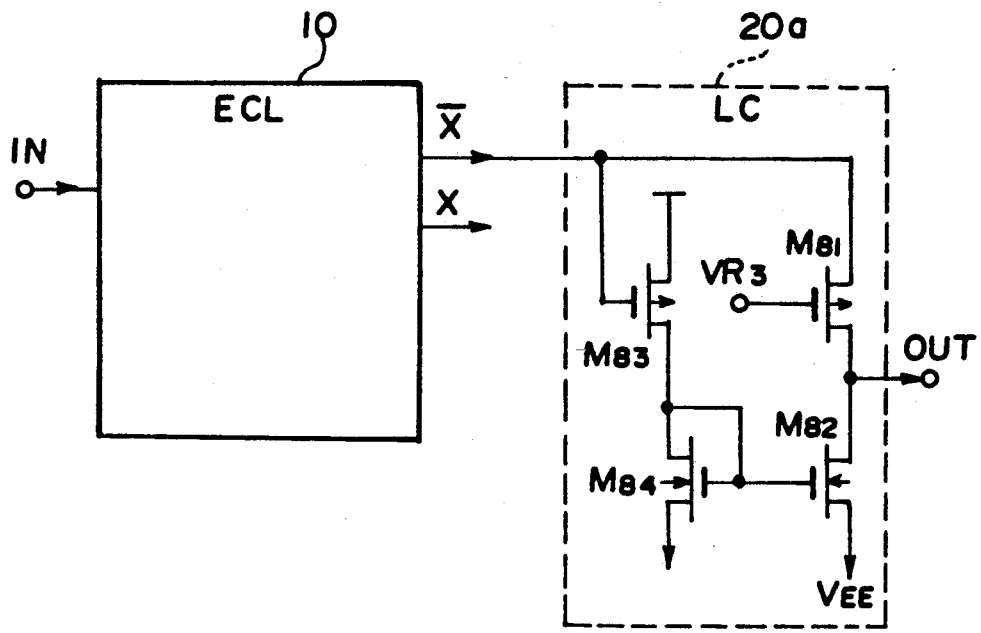
FIG. 8 is a circuit diagram of a second conventional level conversion circuit.

For the purpose of assisting in the understanding of the present invention, conventional level conversion circuits are first described by making reference to FIGS. 7 and 8 before the present invention is explained.

FIG. 7 shows in a circuit diagram a first conventional circuit of the kind to which the present invention relates.

In this conventional circuit, an output signal $\overline{X}$ of an input buffer circuit (ECL) 10 of an ECL (emitter-coupled logic) type which receives an input signal of an ECL level is inputted to the gate of a P-channel MOS transistor (hereinafter referred to as "PMOST") $M_{71}$ forming a part of a CMOS inverter circuit. An N-channel MOS transistor (hereinafter referred to as "NMOST") $M_{72}$ together with an NMOST $M_{74}$ forms a current mirror circuit. The drain of an PMOST $M_{73}$ serving as a current source to the current mirror circuit is connected to the drain of the NMOST $M_{74}$, the output signal $X$ is inputted to the source of the PMOST $M_{73}$ and an appropriate set level ($VR_2$) is supplied to the gate of the PMOST $M_{73}$. A level conversion section (LC) 20 is arranged such that an output signal OUT is outputted from the commonly connected drains of the PMOST $M_{71}$ and the NMOST $M_{72}$. (See, for example, Japanese Patent Application Kokai No. Sho 63(1988)-272119).

Next, the operation of this first conventional circuit is explained.

When a small amplitude signal of an ECL level (high level being −0.9 V and low level being −1.7 V) as an input signal IN is provided to the circuit, the input signal IN is inputted, through an input emitter follower (hereinafter referred to as "EF") circuit formed by a bipolar transistor (hereinafter referred to as "BIPT") $Q_1$ and a constant current source $I_1$, to the base of a BIPT $Q_2$ of a current switching circuit constituted by this BIPT $Q_2$ and a BIPT $Q_3$. To the base of the BIPT $Q_3$ a reference voltage $VR_1$ is supplied. A positive phase output signal X and an opposite phase output signal $\overline{X}$ whose amplitude is determined by a constant current source $I_s$ and load resistors $R_1$ and $R_2$ for the current switching circuit is outputted through an EF-BIPT $Q_4$ and an EF-BIPT $Q_5$. The output signal amplitude of the input buffer circuit 10 is desired to be as large as possible for this output signal to be an input signal which is supplied to the next stage level conversion section 20, but generally an appropriate value which does not cause a marked delay in the input buffer circuit 10 is in the order of 1.5 V. Therefore, the high level H in the PN-junction forward voltage may be −0.8 V and the low level L may be −2.3 V.

When a signal from the input buffer circuit 10 is inputted to the level conversion section 20 and the level thereof is in its H-level, the PMOST $M_{71}$ forming a CMOS inverter circuit turns off since the threshold voltage thereof is $V_{TP} = -0.8$ V. On the other hand, a PMOST $M_{73}$ whose source receives the same signal turns off since the reference voltage $VR_2$ supplied to the gate thereof is set as:

(The amplitudes of the output signals X and $\overline{X}$ + threshold voltage $V_{TP}$ + the PN-junction forward voltage) = −3.3 V and this PMOST $M_{73}$ serves as the constant current source in the operation under a saturated state. The NMOST $M_{74}$ whose gate and drain are connected together is a load for such constant current source and causes the NMOST $M_{72}$ forming the CMOS inverter circuit to turn on as a current mirror circuit. Therefore, the potential of the output signal OUT from the CMOS inverter is at its lowest level ($V_{EE}$) since the discharging of the charge is effected through the NMOST $M_{72}$.

Next, when a signal of a L-level is inputted to the level conversion section 20, the PMOST $M_{71}$ is turned on and PMOST $M_{73}$ is turned off since there appears only the threshold voltage $V_{TP}$ across the source and the gate thereof, whereby the NMOST $M_{72}$ and the NMOST $M_{74}$ which form the current mirror circuit are turned off. Therefore, the output signal OUT is rendered to be the highest potential ($V_{CC}$) due to the charging through the PMOST $M_{71}$.

FIG. 8 is a circuit diagram showing a second conventional arrangement.

As shown in FIG. 8, there is a difference in the arrangement as compared with the first conventional arrangement in that a PMOST $M_{81}$ of the CMOS inverter for outputting a large amplitude signal is of a source input type and an NMOST $M_{83}$ at the current source side of an NMOST $M_{82}$ and an NMOST $M_{84}$ forming the current mirror circuit is of a gate input type. A reference voltage $VR_3$ supplied to the gate of the PMOST $M_{81}$ is the same voltage as the reference voltage $VR_2$ in the first arrangement shown in FIG. 7. (Refer, for example, to ISSCC DIGEST OF TECHNICAL PAPERS (1989) pp32-33.)

Whereas, in the first conventional arrangement, a signal whose phase is opposite to that of an output signal $\overline{X}$ which is an input signal to the level conversion section 20 is obtained as an output signal OUT, the output signal OUT obtained in the second conventional arrangement is of the same phase as the output signal $\overline{X}$.

In the conventional level conversion circuits explained above, the ON and OFF operation at the side of the NMOST which forms the CMOS inverter is effected through the NMOST current mirror circuit which responds to the PMOST switch of either a source input type or a gate input type and, consequently, the operation involves a large time delay. Also, when the output is of a low level, the current mirror circuit of the NMOSTs turns on thereby causing the flow of a through current.

In order to ensure a high speed operation, it is necessary that the turning "ON" capability of the transistors involved be raised, so that the through current is increased and some through current flows even under the "OFF" state. Therefore, in the semiconductor integrated circuit device wherein level conversions are to be effected for a number of input signals, the operational characteristics as explained above are regarded as presenting serious problems to be solved for the realization of a circuit which can operate at a high speed and at a low power dissipation.

An object of the present invention is to provide a level conversion circuit which solves the problems existing in the prior art and in which a high speed and a low power consumption are made possible.

In the level conversion circuit according to the present invention, an input signal having a small amplitude difference is inputted to an input buffer circuit formed by bipolar transistors and a level of an output from such input buffer circuit is converted at a complementary type inverter circuit thereby to output an output signal having a large amplitude difference. One of the main features is that a coupling capacitor is interposed between the gates of the P-channel and N-channel field effect transistors forming the complementary type inverter circuit and this arrangement enables the level conversion circuit to operate at a high speed and at a reduced power consumption.

The capacitor connected between the gate of the P-channel MOS transistor and that of the N-channel MOS transistor forming the complementary type inverter circuit functions as a coupling capacitor, and the output signal forwarded from the input buffer circuit which is inputted to the gate of the P-channel MOS transistor is simultaneously applied to the gate of the N-channel MOS transistor so that the ON and OFF operation of the N-channel MOS transistor is effected speedily. Further, this ON and OFF operation of the N-channel MOS transistor is effected with its gate potentials for the steady states being established by a gate potential setting circuit so that the ON and OFF operation is properly effected based on the level of the output signal forwarded from the input buffer circuit.

Consequently, the ON and OFF switching operation of the N-channel MOS transistor in response to the output signal from the input buffer circuit is at a high speed, resulting in the realization of a circuit to operate at a high speed. Also, a decrease of the through current flowing through the CMOS inverter circuit results in the reduction of power consumption.

Further, by providing a driving circuit formed by bipolar transistors which amplify output signals from the CMOS inverter circuit, it is made possible to effect the charging and discharging of the load capacitance at a high speed and hence to have the circuit operate at a high speed. Also, by providing a decoder circuit between the input buffer circuit and the complementary type inverter circuit with the gate potential setting circuit, it is made possible to decrease further the occurrence of the through current.

Now, some preferred embodiments of the invention are explained with reference to the drawings.

Figure 1:
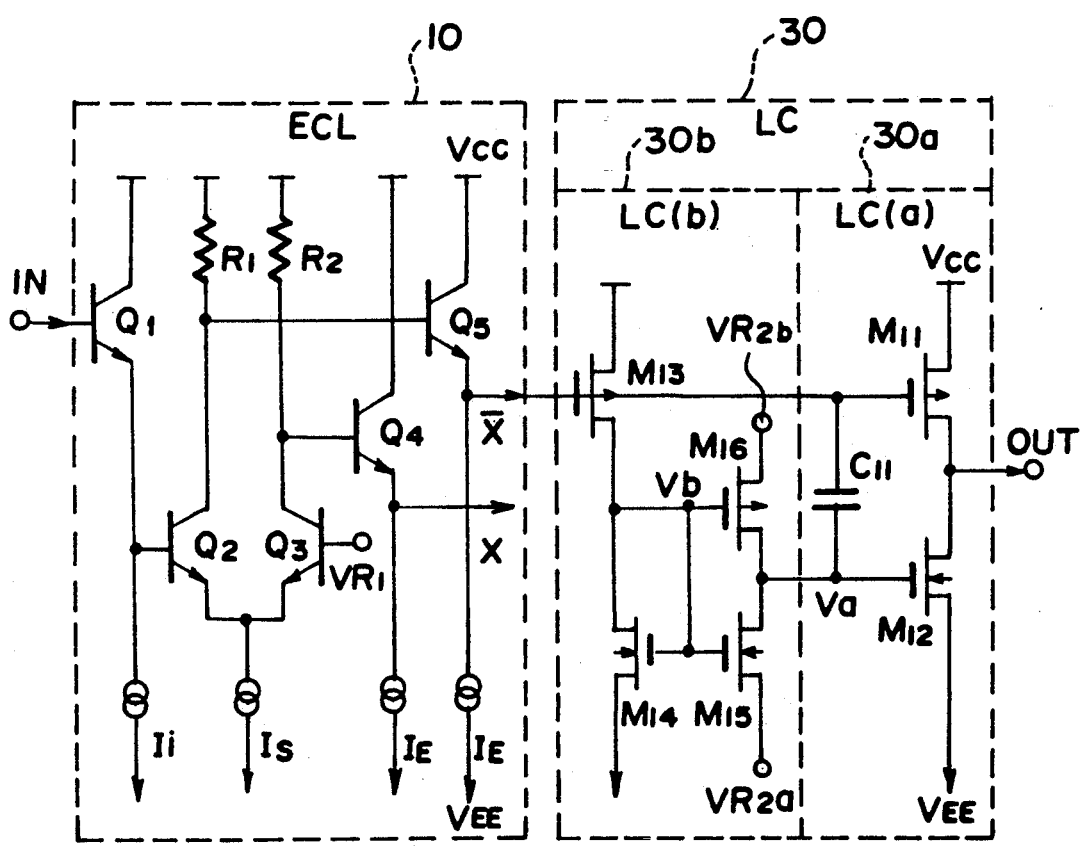
FIG. 1 is a circuit diagram of a level conversion circuit as a first embodiment according to the present invention.

FIG. 1 is a circuit diagram showing a first embodiment of the invention.

An ECL level signal having a small amplitude difference between the high and low levels (High = $-0.9$ V and Low = $-1.7$ V) is applied to the circuit as an input signal IN. The input signal IN is inputted through an input EF circuit of a BIPT $Q_1$ to the base of a BIPT $Q_2$ which together with a BIPT $Q_3$ forms a current switching circuit of emitter-coupled type. A reference voltage $VR_1$ (= $-2.1$ V) is provided to the base of the BIPT $Q_3$. Depending on whether there is a voltage drop across the load resistors $R_1$ and $R_2$ for the collectors of the BIPT $Q_2$ and BIPT $Q_3$ by a constant current source $I_s$, either a L-level signal or a H-level signal is generated. These signals are respectively inputted to the bases of EF-BIPT $Q_4$ and EF-BIPT $Q_5$, and output signals are outputted from the respective emitters thereof, the output signals being either signals X which are of the same phase as the input signal IN or signals $\overline{X}$ which are of the phase opposite to the input signal IN. The symbol $I_E$ is a constant current source for the output EF circuit.

The output signals X and $\overline{X}$ from the input buffer circuit (ECL) 10 is inputted to a level conversion section (LC) 30. The output signal $\overline{X}$ is inputted to the gates of a PMOST $M_{11}$ and an NMOST $M_{12}$ which form a complementary CMOS inverter circuit. The gate of the NMOST $M_{12}$ is coupled to the output signal line $\overline{X}$ through a coupling capacitor $C_{11}$ and an output of the CMOS inverter circuit is an output signal OUT of the level conversion circuit.

In addition to the CMOS inverter circuit (LC(a)) 30a for output driving, there is a gate potential setting circuit (LC(b)) 30b for establishing levels of gate potentials Va of the NMOST $M_{12}$ at its steady states. This circuit comprises a PMOST $M_{13}$ which receives the output signal $\overline{X}$ at its gate, an NMOST $M_{14}$ whose drain and gate are connected together for serving as a load for the PMOST $M_{13}$, and a CMOS inverter circuit formed by a PMOST $M_{16}$ and an NMOST $M_{15}$ and receiving an output voltage Vb at the commonly connected drains of the PMOST $M_{13}$ and NMOST $M_{14}$. Further, the PMOST $M_{16}$ has its source connected to a reference voltage $VR_2$ and the NMOST $M_{15}$ has its source connected to another reference voltage $VR_{2a}$. An output of this CMOS inverter circuit is connected to the gate of the NMOST $M_{12}$ so as to supply the necessary gate potentials.

One of the features of the present invention resides in that, as shown in FIG. 1, the coupling capacitor $C_{11}$ is connected between the gate of the PMOST $M_{11}$ which is a first field effect transistor and the gate of the NMOST $M_{12}$ which is a second field effect transistor, the two transistors PMOST $M_{11}$ and NMOST $M_{12}$ forming the output driving CMOS inverter circuit 30a, and the gate potential setting circuit 30b is provided for selectively setting the gate potentials of the NMOST $M_{12}$ to a first value or to a second value at which the NMOST $M_{12}$ is turned ON or OFF based on the levels of the output signal $\overline{X}$ from the input buffer circuit 10.

Figure 2A:
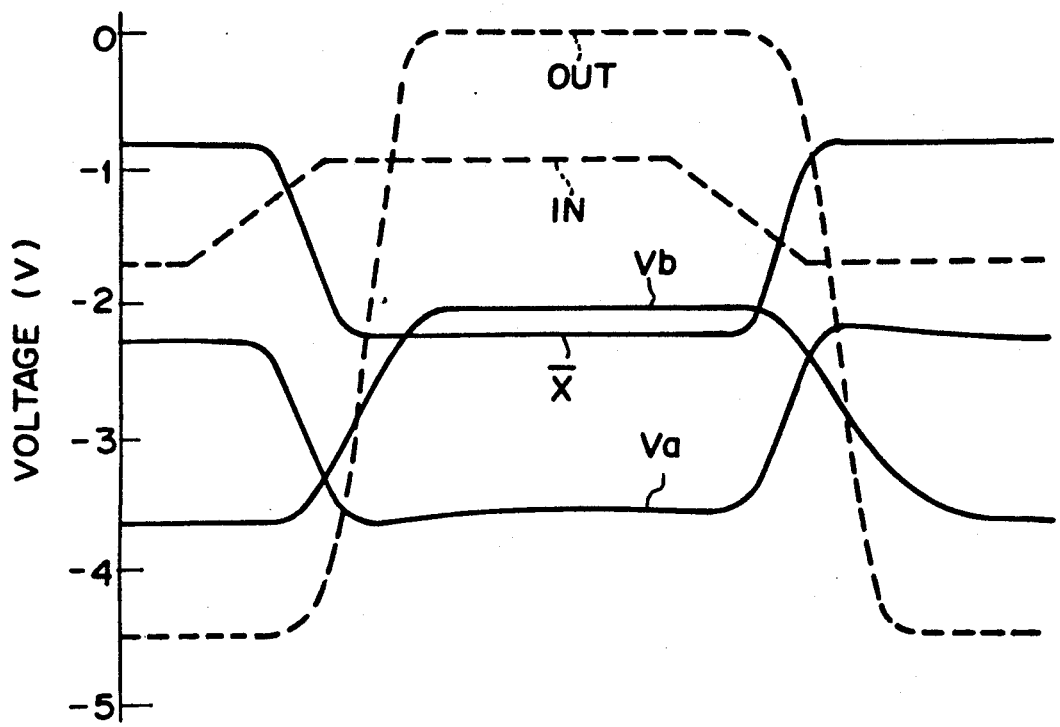
FIGS. 2(a) and 2(b) are diagrams showing waveforms for illustrating the performance of the circuit shown in FIG. 1.
Figure 2B:
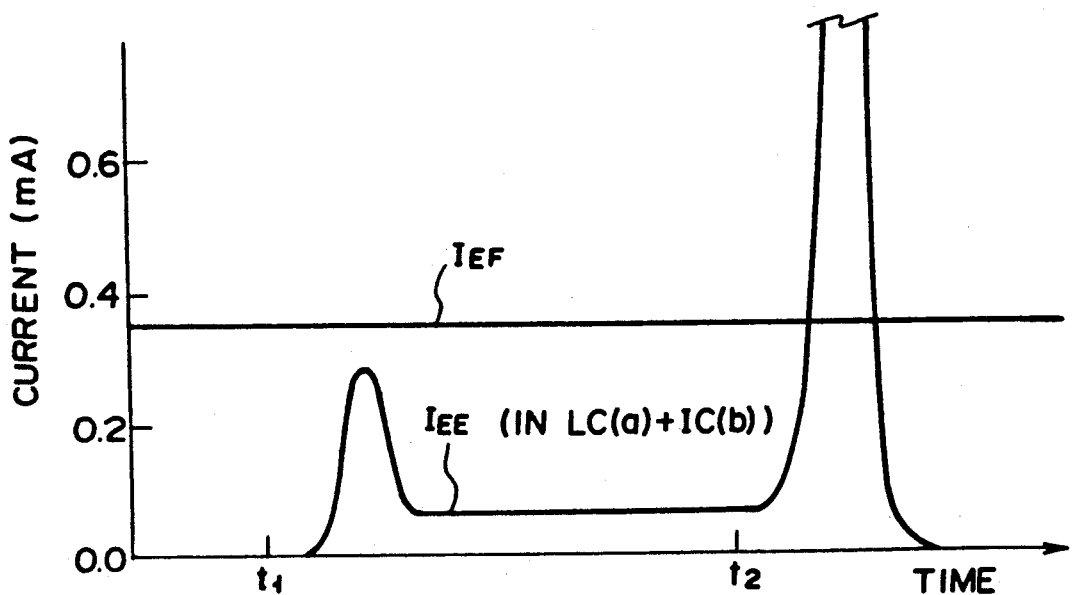

Next, the performance of the circuit according to the first embodiment is explained with reference to FIGS. 2(a) and 2(b). FIG. 2(a) shows changes by time in essential nodes in the circuit which take place when an input signal IN changes, and FIG. 2(b) shows changes by time in power supply currents which flow to the power supply source $V_{EE}$. First, when the input signal IN changes from its L-level to H-level at the time $t_1$, the output signal $\overline{X}$ of the input buffer circuit 10 the phase of which signal is opposite to that of the input signal IN rapidly falls from its H-level $-0.8$ V to its low level $-2.3$ V. The amplitude, that is, the level difference between the H- and L-levels is approximately 1.5 V but this is the most suitable value at which the amplitude is made largest to the extent possible for maintaining a high speed characteristic of the ECL circuit and which facilitates the level conversion in the next stage.

The output signal $\overline{X}$ is inputted to the gate of the PMOST $M_{11}$ of the output driving CMOS inverter circuit 30a in the level conversion section 30. If the threshold voltage $V_{TP}$ of the PMOST $M_{11}$ is set to $V_{TP} \doteq -0.8$ V, the PMOST $M_{11}$ changes from its OFF to ON state due to the fall of the output signal $\overline{X}$. At the same time, since the fall signal of the output signal $\overline{X}$ is transmitted to the gate of the NMOST $M_{12}$ through the coupling capacitor $C_{11}$, the gate potential Va falls with no delay from the change in the output signal $\overline{X}$ to $-3.8$ V if the gate potential Va of the NMOST $M_{12}$ is set to Va = $-2.3$ V at a first steady state. If the threshold voltage $V_{TN}$ of the NMOST $M_{12}$ is set to $V_{TN} \doteq 0.7$ V, the NMOST $M_{12}$ changes from its ON to OFF state under the condition wherein the power supply voltage is $V_{EE} = -4.5$ V. Consequently, the output signal OUT of the output driving CMOS inverter circuit 30a rises from the negative side power supply voltage $V_{EE}$ to the positive side power supply voltage $V_{CC}$.

Next, when the input signal IN turns from its H-level to its L-level at the time $t_2$, the opposite performance takes place so that, since the output signal $\overline{X}$ rises from $-2.3$ V to $-0.8$ V, the PMOST $M_{11}$ changes its state from ON to OFF. If the gate potential Va is set to Va = $-3.8$ V at a second steady state, the gate potential Va also rises from $-3.8$ V to $-2.3$ V based on the change in the output signal $\overline{X}$ whereby the NMOST $M_{12}$ changes its state from OFF to ON, and the output signal OUT falls from the positive side power supply voltage $V_{CC}$ to the negative side power supply voltage $V_{EE}$.

In other words, due to the provision of the coupling capacitor $C_{11}$, the signal changing of the output signal is simultaneously transmitted to the gate of the NMOST $M_{12}$ and, since the PMOST $M_{11}$ and the NMOST $M_{12}$ of the output driving CMOS inverter circuit 30a can be changed to ON or OFF, it is possible to realize a level conversion circuit which is capable of outputting at a high speed a signal having large amplitude swinging between the two power supply voltages and in which a through current is almost eliminated as in an ordinary CMOS circuit. However, since it is necessary to set the gate potentials Va of the NMOST $M_{12}$ at the steady state so as to be prepared for the next transient change, the level conversion circuit of the invention requires the gate potential setting circuit 30b.

Now, the operation of the gate potential setting circuit (LC(b)) 30b is explained.

When the input signal $\overline{X}$ is at a H-level, the PMOST $M_{13}$ turns off so that the output voltage Vb turns to its L-level ($\div -3.8$ V) and the PMOST $M_{16}$ of the CMOS inverter circuit turns on and the NMOST $M_{15}$ turns off. Consequently, the gate potential Va equals to the reference voltage $VR_{2b}$ and thus it is sufficient if the reference voltage $VR_{2b}$ is set to $VR_2 = -2.3$ V. Further, when the output signal $\overline{X}$ is at a L-level, the output voltage Vb rises up to the voltage in the order of $-2$ V whereby the PMOST $M_{16}$ turns off and the NMOST $M_{15}$ turns on, so that it is sufficient if the reference voltage $VR_{2a}$ is set to $VR_{2a} = -3.8$ V. Assuming that the lowest potential is $V_{EE}$, the reference voltages $VR_{2b}$ and $VR_{2a}$ may be obtained based on the amplitude Vx of the output signal $\overline{X}$ and the threshold voltage $V_{TN}$ of the NMOST by the following equations:

$$VR_{2b} = V_{EE} - V_{TN} - |Vx| \text{ and}$$

$$VR_{2a} = V_{EE} - V_{TN}.$$

The gate potential Va of the NMOST $M_{12}$ approaches the steady state set value due to the charging and discharging according to the time constant by the coupling capacitor $C_{11}$ and the impedance under the ON state of the PMOST $M_{16}$ or the NMOST $M_{15}$. This does not require a high speed so that, by making the ON-state impedance of both the transistors PMOST $M_{16}$ and NMOST $M_{15}$ sufficiently large (in the order of 50-100 K$\Omega$ when the coupling capacitor $C_{11}$ is made approximately 0.1-0.3 pF), the abrupt transient signal which is transmitted from the output signal $\overline{X}$ through the capacitor $C_{11}$ causes the occurrence of changes in the gate potential Va with almost no influence from the above charging and discharging.

The change in the current flow in the level conversion section 30 in so far as that seen under the steady state is only that in the through current which flows through the PMOST $M_{13}$ and the NMOST $M_{14}$ when the output signal $\overline{X}$ is at its L-level. However, since this circuit is for establishing the steady state potentials and does not require a high speed response, the capability of the device may be small and the amount of current may be quite small ($<0.1$ mA). Only other currents are a through current transiently generated at the simultaneous ON/ON state of the PMOST $M_{11}$ and NMOST $M_{12}$ of the output driving CMOS inverter circuit 30a and a charging and discharging current to the load capacitance by the output signal OUT.

FIG. 3 is a circuit diagram showing a second embodiment according to the present invention.

In this second embodiment, the input buffer circuit (ECL) 10 is the same as that in the first embodiment shown in FIG. 1. The arrangement which makes this embodiment different from the first embodiment is a gate potential setting circuit for providing a gate potential Va to the NMOST $M_{32}$ in each of the level conversion sections (LC$_1$) 40a and (LC$_2$) 40b.

That is, the reference voltage to which the importance is placed as one feature of the invention is only the reference voltage $VR_2$. A resistor $R_{31}$ is inserted between a reference voltage generating circuit 62 for generating the reference voltage $VR_2$ and the gate of an NMOST $M_{32}$, and an NMOST $M_{36}$ whose drain and gate are connected together is connected to the source of an NMOST $M_{35}$ whose gate receives an output voltage Vb of a CMOS inverter circuit formed by a PMOST $M_{33}$ and an NMOST $M_{34}$, whereby the output voltage Vc is maintained.

In the arrangement as explained above, the steady state gate potential Va of the NMOST $M_{32}$ is such that, when the output signal $\overline{X}$ is at a high level, the PMOST $M_{33}$ turns off. The NMOST $M_{35}$ also turns off because the NMOSTs $M_{34}$ and $M_{35}$ form a current-mirror circuit. Thus, the gate potential Va becomes Va = $VR_2$ due to the charging and discharging current which flows through the resistor $R_{31}$. On the other hand, when the output signal $\overline{X}$ is at an L-level, the PMOST $M_{33}$ turns on and the NMOST $M_{35}$ also turns on owing to the current mirror circuit formed by the NMOST $M_{34}$ and $M_{35}$. In this case, the diode connected NMOST $M_{36}$ substantially clamps the potential Vc between the NMOSTs $M_{35}$ and $M_{36}$ to the voltage $V_{EE} + V_{TH}$ ($V_{TH}$ being a threshold voltage of the NMOST M36).

Here, assume that the resistance value $R_{31}$ of the resistor $R_{31}$ and the impedance R(M35) of the NMOST $M_{35}$ have the following relation.

$$R31 >> R(M35).$$

The gate potential Va is obtained from an impedance division of the sum of the reference voltage $VR_2$ and the above voltage Vc = $V_{EE} + V_{TH}$ at the node Vc. Thus, the gate potential Va becomes Va $\approx$ Vc. In this case, the NMOST M36 and the NMOST $M_{32}$ operate as a current mirror circuit since the impedance R(M35) of the NMOST $M_{35}$ is small. As the through current which flows in the NMOST $M_{36}$ becomes sufficiently small, the NMOST $M_{32}$ becomes in substantially an OFF-state.

As explained above, since the impedance between the reference voltage generating circuit 62 and the gate of the NMOST $M_{32}$ is sufficiently large ($R_{31}$ having high resistance of 50K to several hundreds K$\Omega$), the through current is in the order of several tens $\mu$A, which is almost negligible. As to the resistor $R_{31}$ of high resistance, it requires a large area if this is to be formed as a resistor element by an impurity diffusion layer of a semiconductor substrate surface but, if a resistor by means of a polysilicon layer wiring is used, all that is needed is to replace a part of the metal wiring extending to the reference voltage generating circuit 62 by the polysilicon and this enables to reduce the layout area for the level conversion circuit. In FIG. 3, the numeral 61 denotes a reference voltage generating circuit for generating a reference voltage $VR_1$.

Figure 4:
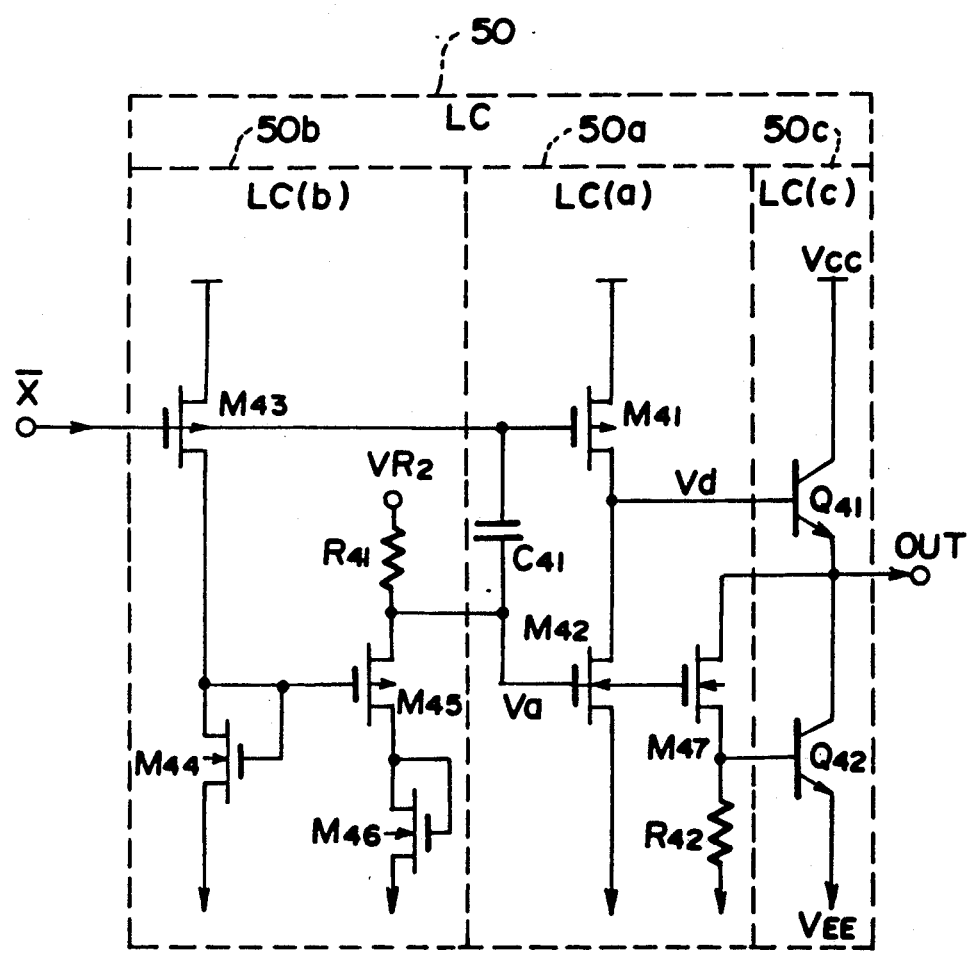
FIG. 4 is a circuit diagram of a level conversion circuit as a third embodiment according to the present invention.

FIG. 4 is a circuit diagram showing a main portion of the circuit of a third embodiment according to the present invention, that is, a level conversion section (LC) 50 which has a high driving capability so as to be able to operate when a large load capacitance is added to the output after the level conversion.

The output driving CMOS inverter circuit (LC(a)) 50a which outputs signals of large amplitude after the level conversion of the output signal $\overline{X}$ from the input buffer circuit and the gate potential setting circuit (LC(b)) 50b which sets the necessary gate potentials Va to the NMOST $M_{42}$ of the inverter circuit (LC(a)) 50a are the same as those shown in FIG. 3 for the second embodiment.

The circuit of this embodiment additionally includes, as one of the features, a driving circuit (LC(c)) 50c of a totem pole type having NPN type BIPT $Q_{41}$ and BIPT $Q_{42}$ connected in series with each other as a circuit for driving the output signal OUT. The output voltage Vd of the CMOS inverter circuit after the level conversion is inputted to the base of the BIPT $Q_{41}$ at the side of $V_{CC}$, and the gate of the NMOST $M_{42}$ and the gate of an NMOST $M_{47}$ are connected with each other whereby the same gate potential Va is held therein. The drain of the NMOST $M_{47}$ is connected to the output OUT and the source thereof is connected to the base of the BIPT $Q_{42}$ at the $V_{EE}$ side. The base of the BIPT $Q_{42}$ has between this and the $V_{EE}$ a resistor $R_{42}$ for turning the BIPT $Q_{42}$ itself off when the NMOST $M_{47}$ is turned off.

The operation of the circuit according to this third embodiment is such that, when the output signal $\overline{X}$ is at a L-level, the PMOST $M_{41}$ turns on and the base current is supplied to the BIPT $Q_{41}$ through the PMOST $M_{41}$, so that the load capacitance added to the output signal OUT is charged at a high speed by the collector current whose magnitude corresponds to the base current being multiplied by the current amplification factor hfe and, thus, the output signal OUT rises substantially to $V_{CC}$. When the output signal $\overline{X}$ is at a H-level, the gate potential Va rises to such high level as Va=$-2.3$ V and the NMOST $M_{47}$ turns on and the base current is supplied to the BIPT $Q_{42}$ from the output OUT through the NMOST $M_{47}$, whereby the load capacitance is discharged at a high speed by the collector current which is as large as that corresponding to the base current being multiplied by the current amplification factor hfe and, thus, the output signal is lowered substantially to $V_{EE}$. Under this state, the NMOST $M_{42}$ also turns on thereby lowering also the output voltage Vd and the BIPT $Q_{41}$ is lowered faster than the output signal OUT.

Figure 5:
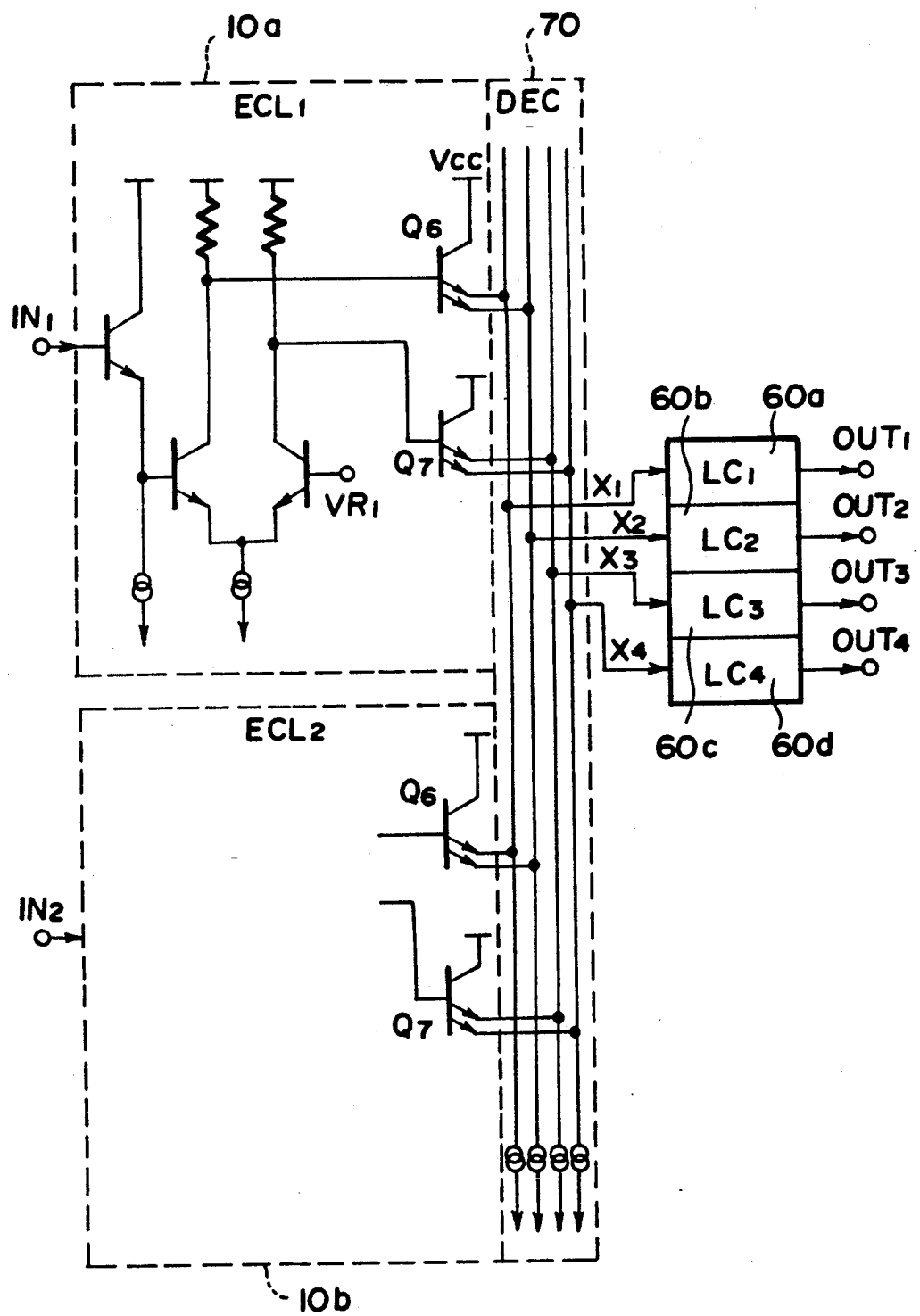
FIG. 5 is a circuit diagram of a level conversion circuit as a fourth embodiment according to the present invention.

FIG. 5 is a circuit diagram illustrating a fourth embodiment according to the present invention and showing a circuit which includes a decoder circuit in addition to the input buffer circuit and the level conversion section.

The fourth embodiment is arranged as one of the features of the invention such that the two input signals $IN_1$ and $IN_2$ are respectively provided with input buffer circuits ($ECL_1$) 10a and ($ECL_2$) 10b and a negative and a positive signal are outputted from each of these input buffer circuits. However, output EF-BIPTs $Q_6$ and $Q_7$ are of a multi-emitter type and, as shown in FIG. 5, are emitter-coupled thereby performing a wired-OR operation. The decoder circuit (DEC) 70 thus formed is one in which one of the output signals $X_1-X_4$ is of a L-level and each of the other three output signals is of a H-level.

The addition of the decoder circuit 70 has almost no influence on such causes as those associated to changes in levels or delays in speed. Therefore, by inputting the output signals $X_1-X_4$ directly to the respective level conversion sections ($LC_1$) 60a, ($LC_2$) 60b, ($LC_3$) 60c and ($LC_4$) 60d, it is possible to obtain the decoded output signals $OUT_1-OUT_4$ whose amplitude, that is, level difference between H- and L-levels is large.

One of the advantages in this arrangement is that, in having the decoder formed after the level conversion, a part of the decoder can be put in before the level conversion and this enables to reduce the number of stages of the decoders. Also, since the input signals subject to the level conversion are such that only one is of a L-level and each of a plurality of other input signals is of a H-level, it is possible to reduce a small amount of the through current even further.

Figure 6:
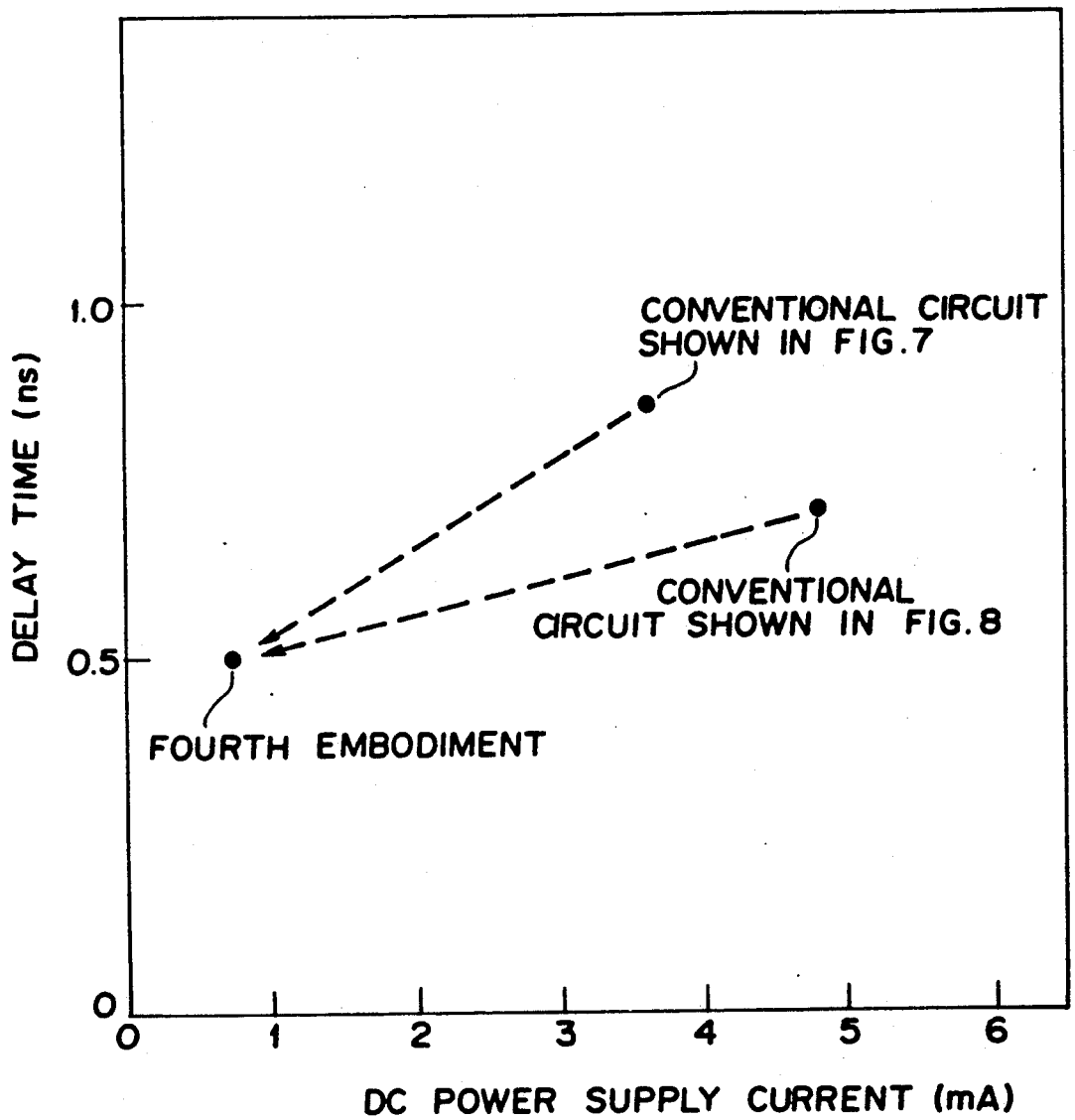
FIG. 6 is a diagram showing a comparison of performance characteristics in the embodiments according to the present invention and those in the prior art.

FIG. 6 shows a comparison of characteristics in the prior art and in the fourth embodiment (shown in FIG. 5) in which the level conversion circuit according to the present invention is utilized in a static RAM of 256K-1M bits. Here, the circuit assumed is one in which 256 word lines are decoded by 8 address lines and FIG. 6 shows the relation of the delay time with respect to the power supply current at the level conversion section.

From the comparison with the first prior art in which the output is of the same phase as that of the input to the level conversion circuit and the second prior art in which the output is of the opposite phase as that of the input to the level conversion circuit, it can be readily appreciated that, in the circuit of the present invention, the power supply current is reduced to 1/5-1/6 and the delay time is shortened by 30-40%, which means that both the large reduction in power consumption and the large increase in speed have been achieved at the same time.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A level conversion circuit comprising:

a first and a second power supply source ($V_{CC}$, $V_{EE}$);

an input buffer circuit (10) which includes a pair of emitter-coupled bipolar transistors (Q2, Q3) and which receives an input signal having a small amplitude and outputs at a first output terminal a first output signal having a predetermined phase and amplitude;

a level conversion section (30a) which is connected to said first output terminal of said input buffer circuit and which outputs at a second output terminal (OUT) a second output signal having a level which has been converted into a large amplitude from said small amplitude of said input signal, said level conversion section including a coupling capacitor (C11) and a complementary type invertor circuit formed by a first P-channel type field effect transistor (M11) and a second N-channel type field effect transistor (M12), said first field effect transistor (M11) having a source terminal connected to said first power supply source, a gate terminal connected directly to said first output terminal of said input buffer circuit, and a drain terminal connected to said second output terminal, and said second field effect transistor (M12) having a drain connected to said second output terminal, a gate terminal coupled to said first output terminal of said input buffer circuit through said coupling capacitor (C11), and a source connected to said second power supply source; and a gate potential setting circuit (30b) which is connected to said first output terminal of said input buffer circuit and which sets a first and a second gate potential for said second field effect transistor (M12) whose gate terminal receives said output signal from said input buffer circuit through said coupling capacitor so that said second field effect transistor switches to a conductive state or a non-conductive state depending on a level of said first output signal from said input buffer circuit.

2. A level conversion circuit according to claim 1, in which said gate potential setting circuit (30b) comprises:

a first and a second reference voltage source (VR$_{2b}$, VR$_{2a}$);

a third P-channel type field effect transistor (M13) having a source, a gate and a drain terminal, said source terminal being connected to said first power supply source, and said gate terminal being connected to said first output terminal of said input buffer circuit;

a fourth N-channel type field effect transistor (M14) having gate and drain terminals connected together and further being connected to said drain terminal of said third field effect transistor, which serves as a load for said third field effect transistor (M13);

a fifth P-channel type field effect transistor (M16) having a source terminal connected to said first reference voltage source (VR$_{2b}$), a gate terminal connected to the common gate and drain terminals of said fourth field effect transistor, and a drain terminal connected to the gate terminal of said second field effect transistor; and a sixth N-channel type field effect transistor (M15) having a source terminal connected to said second reference voltage source (VR$_{2a}$), a gate terminal connected to the common gate and drain terminals of said fourth field effect transistor, and a drain terminal connected to the gate terminal of said second field effect transistor, said fifth and sixth field effect transistors together forming an invertor circuit.

3. A level conversion circuit according to claim 1, in which said gate potential setting circuit (62) comprises:

a first reference voltage source (62) for setting said gate potential of said second field effect transistor at the first value;

a resistor (R31) connected between said first reference voltage source and the gate terminal of said second field effect transistor; and a control circuit (M33-M36) for changing said gate potential to said first value or to the second value corresponding to a potential divided by said resistor responsive to the level of said second output signal from said input buffer circuit.

4. A level conversion circuit according to claim 1, which further includes a driving circuit formed by a first and a second bipolar transistor connected in series between said first and second power supply sources, which receives said second output signal from said complementary type invertor circuit and which amplifies said second output signal and outputs a resulting signal.

5. A level conversion circuit according to claim 2, which comprises a plurality N of said input buffer circuits each for outputting a plurality M of said first output signals, a decoder circuit for receiving and decoding a plurality M—N of said first output signals and for outputting a plurality M of decoded output signals, and a plurality M of said level conversion sections for receiving respectively a plurality M of said decoded output signals and outputting a plurality M of said second output signals after the level conversion having been effected.

* * * * *